(12) United States Patent
Tomifuji et al.

(10) Patent No.: US 9,358,587 B2
(45) Date of Patent: Jun. 7, 2016

(54) SUBSTRATE TREATING APPARATUS

(71) Applicant: DAINIPPON SCREEN MFG. CO., LTD., Kyoto (JP)

(72) Inventors: Yukio Tomifuji, Kyoto (JP); Shigeki Minami, Kyoto (JP); Kazuo Jodai, Kyoto (JP); Norio Yoshikawa, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 359 days.

(21) Appl. No.: 13/785,673

(22) Filed: Mar. 5, 2013

(65) Prior Publication Data

US 2013/0255732 A1  Oct. 3, 2013

(30) Foreign Application Priority Data

Mar. 29, 2012 (JP) .................... 2012-075690

(51) Int. Cl.
*H01L 21/02* (2006.01)
*B08B 3/02* (2006.01)
*H05K 3/00* (2006.01)

(52) U.S. Cl.
CPC .............. *B08B 3/022* (2013.01); *H05K 3/0085* (2013.01); *H05K 2203/104* (2013.01); *H05K 2203/1509* (2013.01); *H05K 2203/1545* (2013.01); *H05K 2203/1572* (2013.01)

(58) Field of Classification Search
CPC ................................................ H01L 21/02076
See application file for complete search history.

(56) References Cited

U.S. PATENT DOCUMENTS

2010/0086793 A1   4/2010   Kawashita et al. ........... 428/458

FOREIGN PATENT DOCUMENTS

| JP | 63-114998 | 5/1988 |
| JP | 04-216700 | 8/1992 |
| JP | 05-218625 | 8/1993 |
| JP | 07-326650 | 12/1995 |
| JP | 10-107450 | 4/1998 |
| JP | 2005-056887 | 3/2005 |
| JP | 2005-149817 | 6/2005 |
| KR | 10-2009-0127897 | 12/2009 |
| TW | I229048 | 3/2005 |

OTHER PUBLICATIONS

Korean Office Action issued May 26, 2014 in corresponding Korean Patent Application No. 10-2013-0023922.

*Primary Examiner* — Jason Ko
(74) *Attorney, Agent, or Firm* — Ostrolenk Faber LLP

(57) ABSTRACT

A substrate treating apparatus includes a loading section 1, a treating tank 2, a rinsing tank 4, a drying tank 5, an unloading section 6, and a pair of endless belt members 7 for transporting substrates successively through the loading section 1, treating tank 2, rinsing tank 4, drying tank 5 and unloading section 6. The substrate treating apparatus further includes a fixing mechanism for fixing a pair of side edges of each substrate parallel to a transport direction of the substrate to the endless belt members 7. In the loading section 1, a plurality of substrates are fixed, each with the pair of edges thereof parallel to the transport direction fixed at constant intervals to the pair of endless belt members 7. The substrates having undergone the treatment are removed from the pair of endless belt members 7 in the unloading section 6.

4 Claims, 18 Drawing Sheets

SUBSTRATE TREATING APPARATUS

BACKGROUND OF THE INVENTION

1. Field of the Invention

This invention relates to a substrate treating apparatus for simultaneously treating both surfaces of a flexible rectangular substrate by horizontally transporting the substrate and supplying a treating solution to both the surfaces of the substrate.

2. Description of the Related Art

A printed substrate and a substrate for electronic paper are formed of a flexible rectangular material, for example. With regard to such a substrate, edge areas adjacent the four sides forming the rectangular shape are contactable areas, but the areas other than the edge areas are non-contactable areas.

A substrate for electronic paper, for example, has a construction having a support layer, an adhesive layer and an electronic paper film laminated in this order. The electronic paper film is slightly smaller in size than the support layer. The edges of the electronic paper film are located about 10 mm inward of those of the support layer. With regard to this substrate for electronic paper, contact with the electronic paper film is forbidden in order to improve precision of the product. During transport of the substrate for electronic paper, for example, contact is permitted only with peripheral areas of the support layer on the side having the electronic paper film thereon. Generally, other substrates in addition to the substrate for electronic paper have central portions that are non-contactable areas and peripheral portions that are contactable areas.

When simultaneously treating both surfaces of the substrate in such a structure by supplying a treating solution to both surfaces, transporting the substrate with transport rollers, for example, would require the transport rollers to contact the lower surface of the substrate, making it impossible to treat the substrate properly.

Japanese Unexamined Patent Publication H10-107450 discloses a method of manufacturing multilayer printed wiring boards, which develops the multilayer printed wiring boards using a developing jig. The developing jig used in this manufacturing method consists of a metal framework, and a metal bar or metal frame flexibly extended through elastic elements to right and left frames inside the framework. The framework includes hooks attached to outer positions of an upper frame thereof for use in transporting the jig, and upper hooks attached to inner positions of the upper frame for suspending a substrate by the upper end thereof. On the other hand, the metal bar or metal frame includes lower hooks for connecting the lower end of the substrate to the jig. The substrate fixed to this developing jig is transported to a developing chamber, with the hooks attached to the outer position of the upper frame of the jig framework being hooked to a transport rail. In the developing chamber, a developer is sprayed toward both surfaces of the substrate in a vertical posture, from both right and left sides of the jig.

When developing a substrate using the apparatus described in Japanese Unexamined Patent Publication H10-107450, it is necessary to attach the substrate to the developing jig, which lowers treatment efficiency. Analogous to the jig described in the above publication, it is conceivable to use a frame like a picture frame to hold a flexible rectangular substrate, and simultaneously treat both surfaces of the substrate by supplying a treating solution to both surfaces while transporting the substrate with the frame. However, where such construction is employed, there will arise a problem that not only does the treating solution stagnating in the frame impair uniform treatment, but make cleaning and drying of frame portions difficult.

SUMMARY OF THE INVENTION

The object of this invention, therefore, is to provide a substrate treating apparatus which can uniformly treat both back and front surfaces of a flexible substrate without contacting non-contactable areas in the central part to the substrate.

The above object is fulfilled, according to this invention, by a substrate treating apparatus for simultaneously treating both surfaces of a flexible rectangular substrate by horizontally transporting the substrate and supplying a treating solution to both surfaces of the substrate, comprising a pair of endless belts for supporting a pair of edges parallel to a transport direction of the substrate; and a fixing device for fixing the pair of side edges of the substrate parallel to the transport direction of the substrate to the pair of endless belts.

Such a substrate treating apparatus can uniformly treat both back and front surfaces of a flexible substrate without contacting non-contactable areas in the central part to the substrate.

In one preferred embodiment, the fixing device comprises a pair of second endless belts respectively opposed to the pair of endless belts for pinching the substrate with the pair of endless belts.

In another preferred embodiment, the apparatus treats both surfaces of the substrate with the treating solution by passing the substrate transported as fixed to the pair of endless belts, through the treating solution stored in a treating tank.

With this substrate treating apparatus, both surfaces of the substrate can be treated simultaneously and uniformly when the substrate passes through the treating solution stored in the treating tank.

In a further preferred embodiment, the apparatus treats both surfaces of the substrate with the treating solution by spraying the treating solution toward both surfaces of the substrate transported as fixed to the pair of endless belts.

With this substrate treating apparatus, both surfaces of the substrate can be treated simultaneously and uniformly by spraying the treating solution toward both surfaces of the substrate.

Other features and advantages of the invention will be apparent from the following detailed description of the embodiments of the invention.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Figure 1:
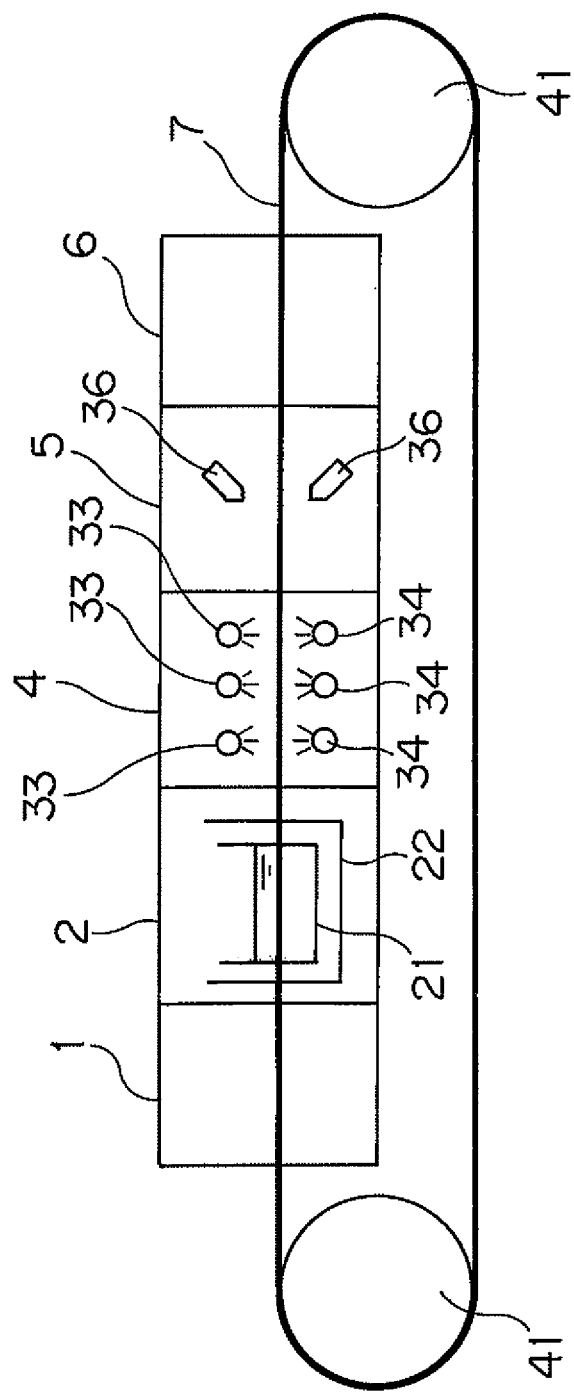
FIG. 1 is a schematic side view of a substrate treating apparatus according to a first embodiment of this invention.

Embodiments of this invention will be described hereinafter with reference to the drawings. FIG. 1 is a schematic side view of a substrate treating apparatus according to a first embodiment of this invention.

This substrate treating apparatus includes a loading section 1, a treating tank 2, a rinsing tank 4, a drying tank 5, an unloading section 6, and an endless belt 7 for transporting substrates to the loading section 1, treating tank 2, rinsing tank 4, drying tank 5 and unloading section 6 in thie order. The endless belt 7 is wound around and extends between a pair of pulleys 41. One of these pulleys 41 acts as a drive pulley rotatable by drive of a motor not shown, and the other acts as a driven pulley. As detailed hereinafter, the endless belt 7 consists of a pair of belt members spaced apart from each other by a distance in a direction perpendicular to a transport direction of rectangular substrates and corresponding to the width of each substrate (the distance between the pair of edges parallel to the transport direction), so as to support the pair of edges of each substrate extending in the transport direction of the substrate.

The treating tank 2 is provided for simultaneously treating both surfaces of each substrate with a treating solution by supplying the treating solution to both the surfaces thereof, and has a treating solution tank 21 for storing the treating solution. The rinsing tank 4 is provided for simultaneously rinsing both the surfaces of each substrate time by supplying rinsing water to both the surfaces thereof, and has a plurality of nozzles 33 for spraying the rinsing water to the upper surface of each substrate and a plurality of nozzles 34 for spraying the rinsing water to the lower surface thereof. The drying tank 5 is provided for drying the substrates, and has a pair of air knives 36 for blowing compressed air to both the surfaces of each substrate.

This substrate treating apparatus includes a fixing mechanism for fixing the pair of edges parallel to the transport direction of each substrate to the pair of endless belt members 7. In the loading section 1, a plurality of substrates are fixedly arranged at constant intervals, with the pair of edges thereof parallel to the transport direction fixed to the pair of endless belt members 7. The substrates having undergone the treatment are removed from the pair of endless belt members 7 in the unloading section 6. The construction of this fixing mechanism will be described in detail hereinafter.

Figure 2:
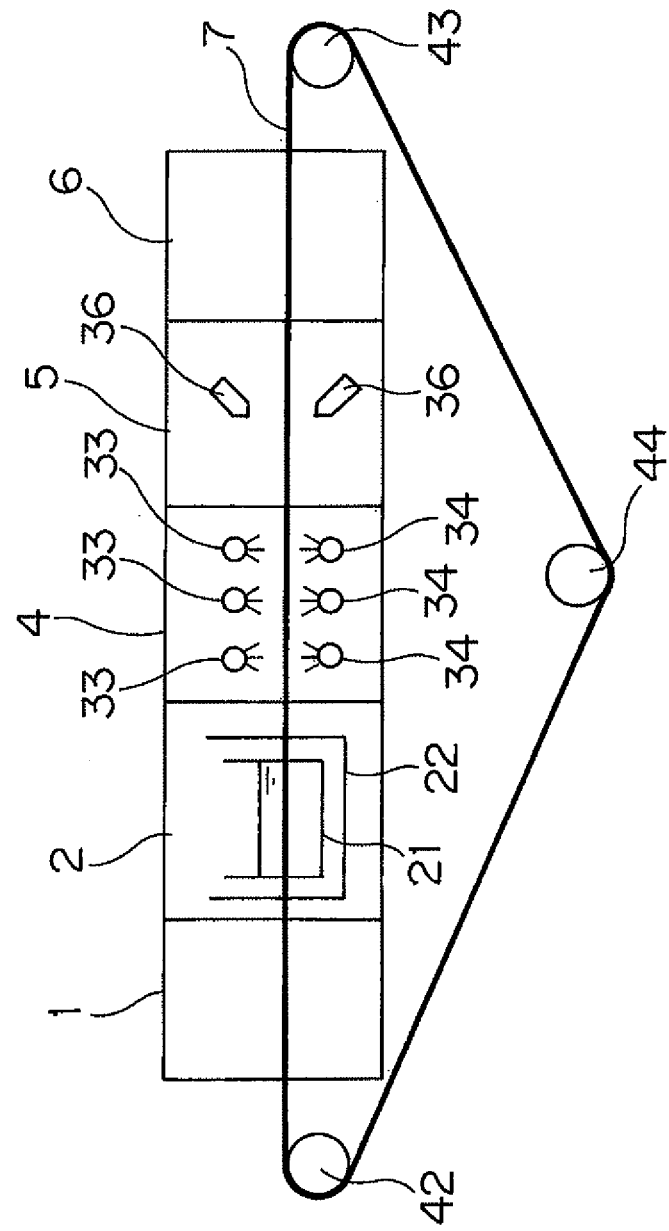
FIG. 2 is a schematic side view showing a modification of the substrate treating apparatus according to the first embodiment.

FIG. 2 is a schematic side view showing a modification of the substrate treating apparatus according to the first embodiment shown in FIG. 1.

In the substrate treating apparatus shown in FIG. 1, the endless belt 7 is wound around and extends between the relatively large pulleys 41, and makes a forward motion, passing through the loading section 1, treating tank 2, rinsing tank 4, drying tank 5, and unloading section 6. By contrast, in the substrate treating apparatus shown in FIG. 2, the endless belt 7 is wound around three pulleys 42, 43 and 44, and makes a forward motion, passing through the loading section 1, treating tank 2, rinsing tank 4, drying tank 5, and unloading section 6. One of the three pulleys 42, 43 and 44 is a drive pulley rotatable by drive of a motor not shown, and the other two are driven pulleys.

Figure 3:
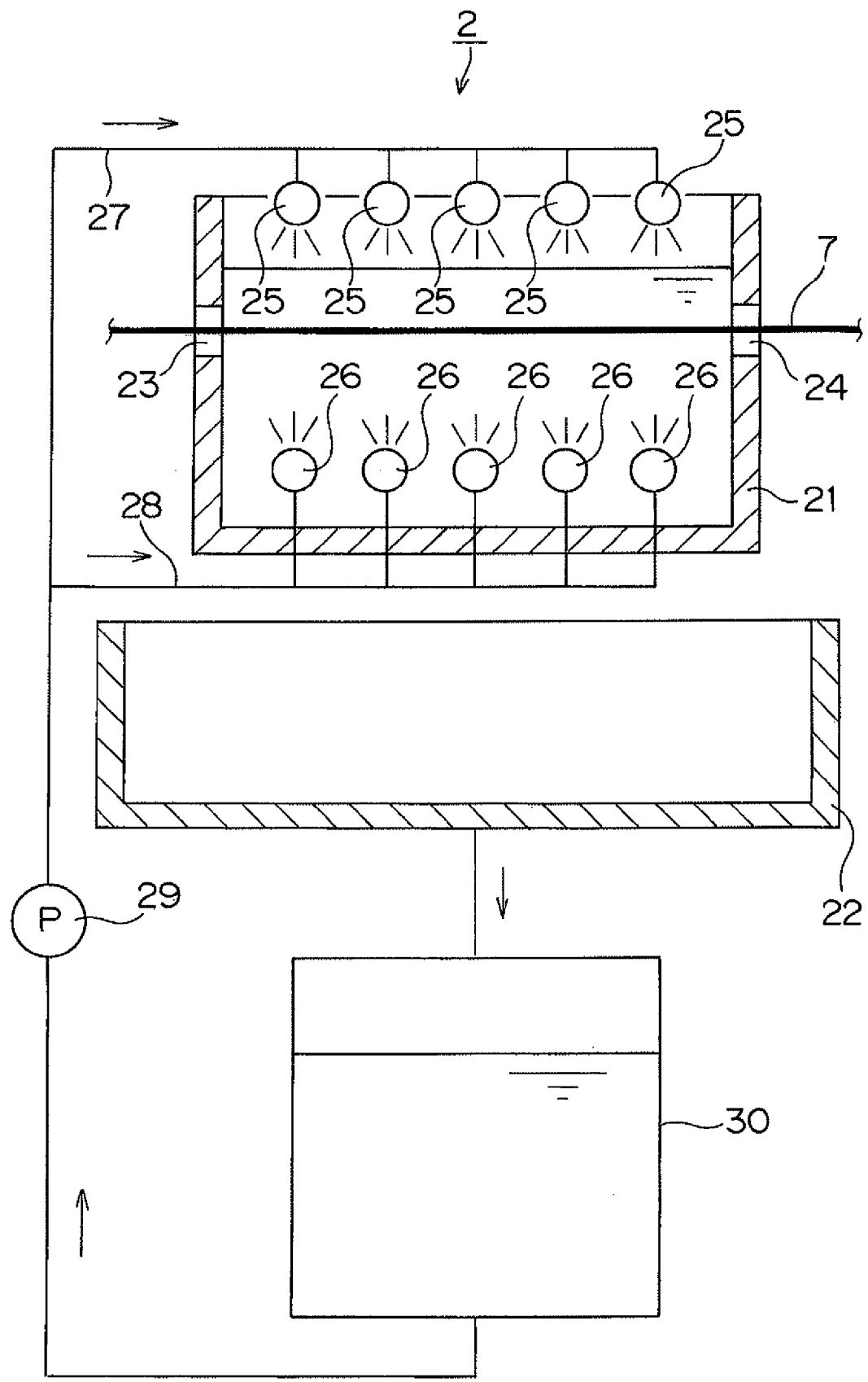
FIG. 3 is a schematic view of a treating tank.

FIG. 3 is a schematic view of the treating tank 2 shown in FIGS. 1 and 2.

This treating tank 2 is provided for treating, with the treating solution and at the same time, both front and back surfaces of each rectangular substrate carried in and out as fixed to the endless belt 7, and has the treating solution tank 21 which stores the treating solution for treating the substrates, a treating solution collecting tank 22, and a storage tank 30 which stores the treating solution. This treating tank 2 also includes a plurality of treating solution jet nozzles 25 for supplying the treating solution from above the treating solution tank 21, and a plurality of treating solution jet nozzles 26 for supplying the treating solution from below the substrates fixed to the endless belt 7 in the treating solution stored in the treating solution tank 21. The substrates are horizontally transported in the treating solution tank 21, with opposite side edges of the substrates fixed by the endless belt 7.

The treating solution tank 21 has a substrate loading port 23 and a substrate unloading port 24 formed therein. Using these loading port 23 and unloading port 24, the endless belt 7 carries the substrates into and out of the treating solution tank 21. The collecting tank 22 is provided for collecting the treating solution flowing down from the loading port 23 and unloading port 24 of the treating solution tank 21. This collecting tank 12 is connected to the storage tank 30 through a treating solution collecting pipe. The treating solution in the storage tank 30 is, by action of a pump 29, fed to the treating solution jet nozzles 25 through pipeline 27 and to the treating solution jet nozzles 26 through pipeline 28.

Figure 4:
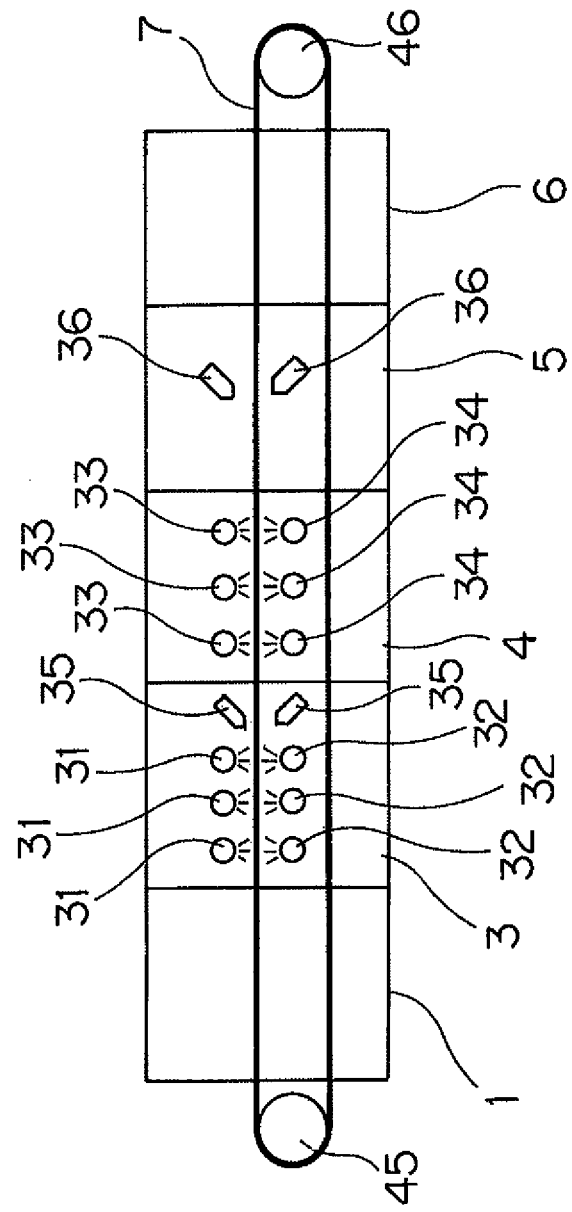
FIG. 4 is a schematic side view of a substrate treating apparatus according to a second embodiment of this invention.

Next, another embodiment of the substrate treating apparatus will be described. FIG. 4 is a schematic side view of a substrate treating apparatus according to a second embodiment of this invention. Like reference numerals are used to identify like parts which are the same as in the first embodiment shown in FIGS. 1 and 2 and will not particularly be described again.

The substrate treating apparatus according to this second embodiment employs a treating tank 3 having a construction for spraying the treating solution to both surfaces of each substrate, in place of the treating tank 2 having the treating solution tank 21 in the substrate treating apparatus shown in FIGS. 1 and 2. This treating tank 3 has a plurality of treating solution jet nozzles 31 for spraying the treating solution to the upper surface of each substrate, a plurality of treating solution jet nozzles 32 for spraying the treating solution to the lower surface of each substrate, and a pair of air knives 35 for blowing compressed air to both surfaces of each substrate to remove the treating solution adhering to the substrate.

In the substrate treating apparatus shown in FIGS. 1 and 2, the single region (forward moving portion) of the endless belt 7 passes through the loading section 1, treating tank 2, rinsing tank 4, drying tank 5 and unloading section 6. In the substrate treating apparatus shown in FIG. 4, by contrast, the endless belt 7 is wound around a pair of relatively small pulleys 45 and 46, and makes forward and backward motions, reciprocatively passing through the loading section 1, treating tank 3, rinsing tank 4, drying tank 5 and unloading section 6.

Figure 5A:
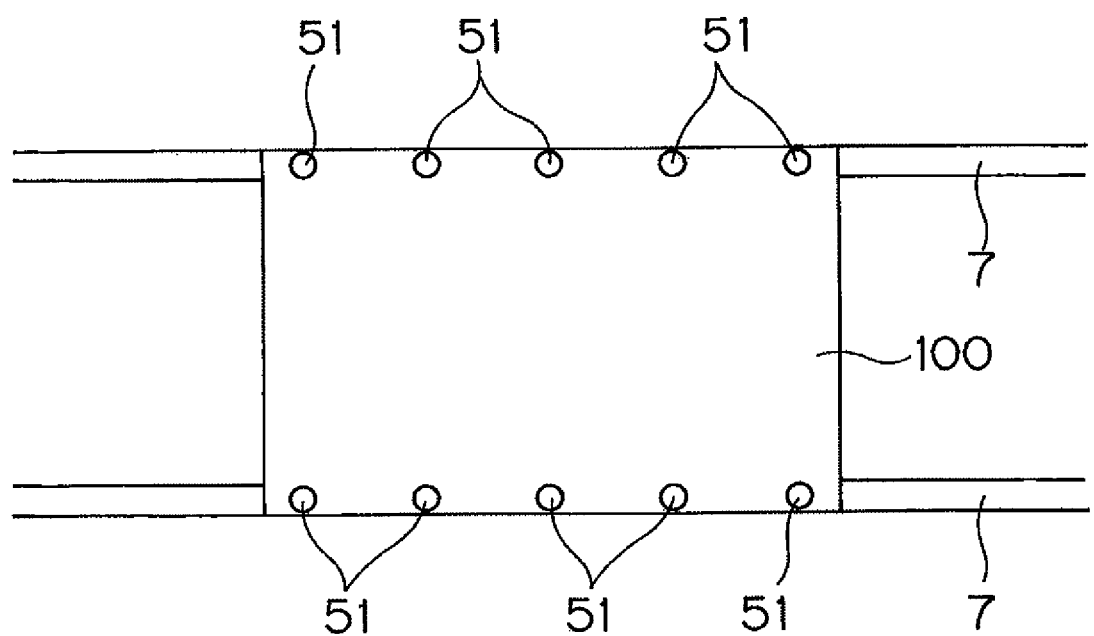
FIG. 5A is an explanatory view of a fixing mechanism according to a first embodiment.
Figure 5B:
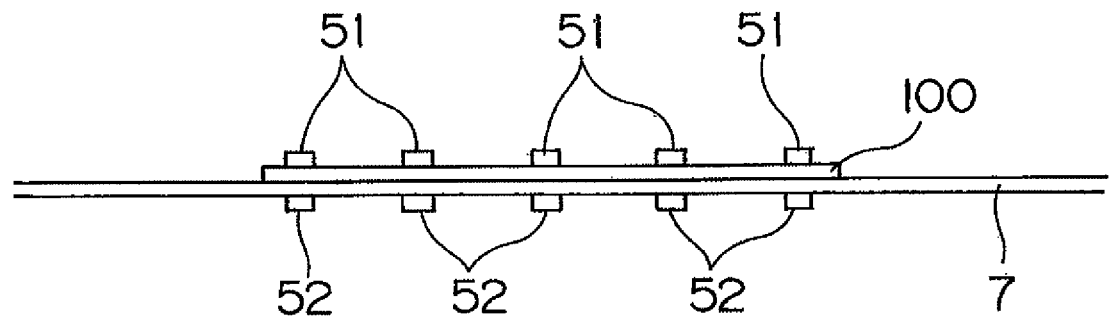
FIG. 5B is an explanatory view of the fixing mechanism according to the first embodiment.
Figure 6A:
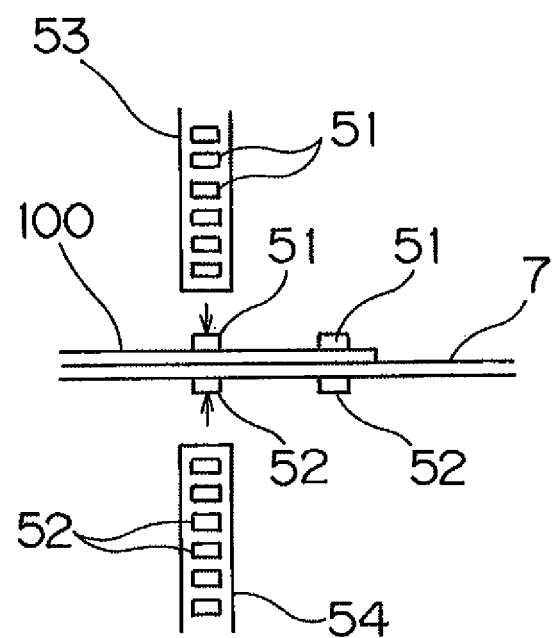
FIG. 6A is an explanatory view showing attachment and detachment of magnets.
Figure 6B:
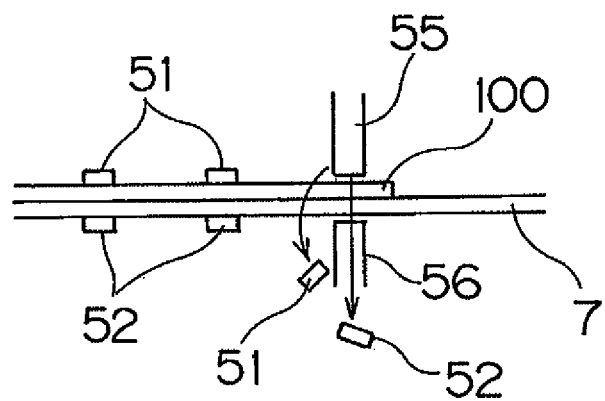
FIG. 6B is an explanatory view showing attachment and detachment of the magnets.

Next, a construction of a fixing mechanism for fixing a pair of side edges of each substrate parallel to the transport direction to the pair of endless belt members 7 will be described. FIGS. 5A and 5B are explanatory views of the fixing mechanism according to a first embodiment. FIG. 5A is a plan view and FIG. 5B a side view. FIGS. 6A and 6B are explanatory views showing attachment and detachment of magnets 51 and 52.

The fixing mechanism according to this first embodiment includes pairs of upper and lower magnets 51 and 52 for pinching the endless belt members 7 and each substrate 100. The substrate 100 is transported as supported by the endless belt members 7, with the pair of side edges thereof parallel to the transport direction fixed to the surfaces of the endless belt members 7 by these magnets 51 and 52. The loading section 1 shown in FIGS. 1, 2 and 4 has a feeder 53 of magnets 51 and a feeder 54 of magnets 52 arranged oppositely to each other as shown in FIG. 6A. The magnets 51 and 52 are fed from these feeders 53 and 54, at constant intervals, to the side edges of the substrate 100, and pinch the substrate 100 and endless belt members 7. The unloading section 6 shown in FIGS. 1, 2, and 4 has contact members 55 and 56 arranged oppositely to each other as shown in FIG. 6B for contacting the magnets 51 and 52 transported with movement of the endless belt members 7. The magnets 51 and 52 are removed, by contacting these contact members 55 and 56, from the positions pinching the substrate 100 and endless belt members 7.

Figure 7A:
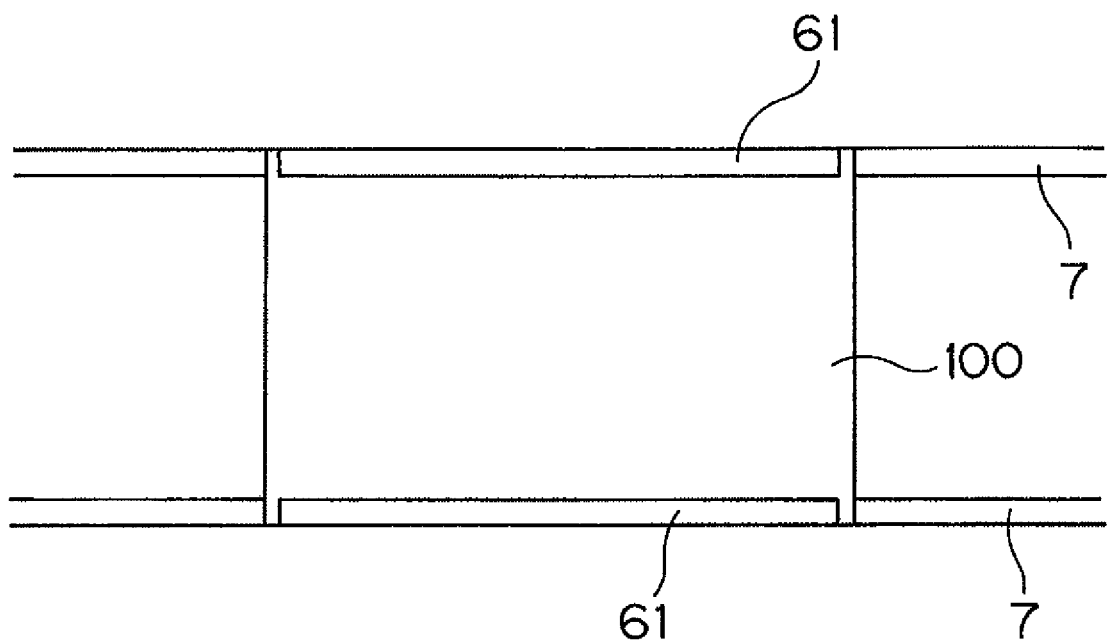
FIG. 7A is an explanatory view of a fixing mechanism according to a second embodiment.
Figure 7B:
FIG. 7B is an explanatory view of the fixing mechanism according to the second embodiment.

FIGS. 7A and 7B are explanatory views of a fixing mechanism according to a second embodiment. FIG. 7A is a plan view and FIG. 7B a side view.

In the fixing mechanism shown in FIGS. 6A and 6B, magnets 51 and 52 are arranged at constant intervals at the side edges of each substrate 100 for pinching the substrate and endless belt members 7. The embodiment shown in FIGS. 7A and 7B, by contrast, employs a construction for fixing the edges of each substrate 100 to the endless belt members 7 using pairs of elongate magnets 61 and 62 having a length approximately equal to that of the side edges of each substrate parallel to the transport direction 100.

Figure 8A:
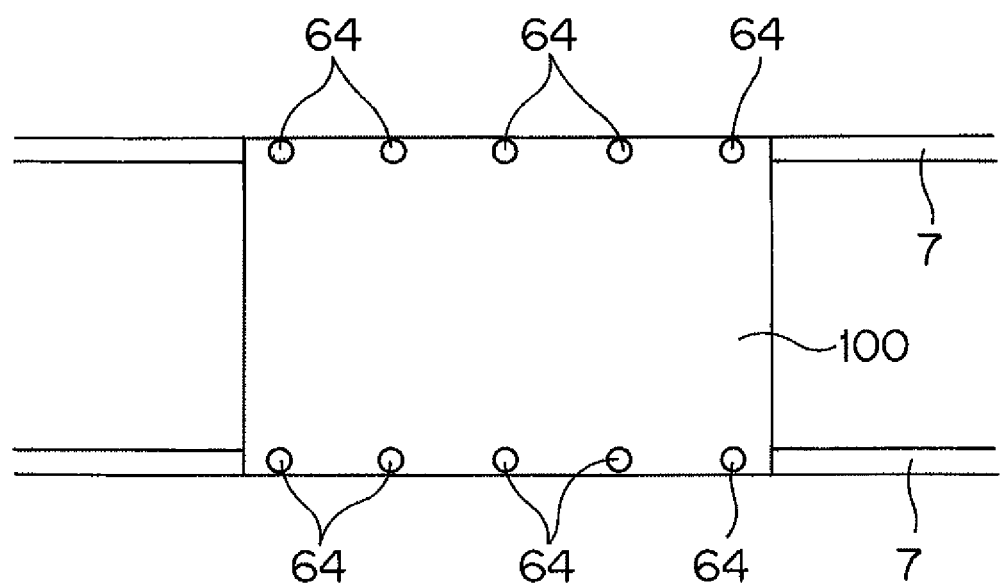
FIG. 8A is an explanatory view of a fixing mechanism according to a third embodiment.
Figure 8B:
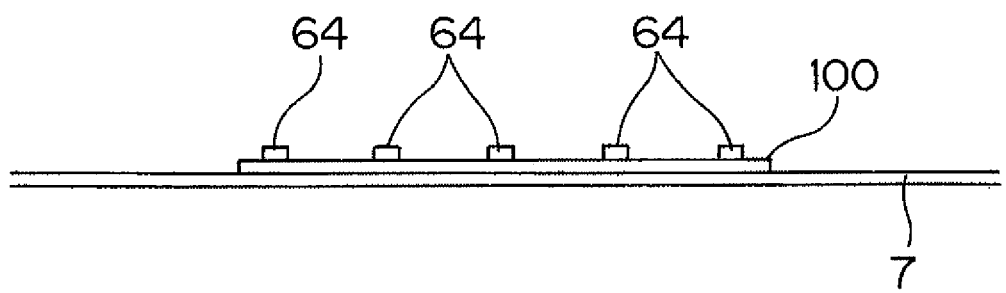
FIG. 8B is an explanatory view of the fixing mechanism according to the third embodiment.

FIGS. 8A and 8B are explanatory views of a fixing mechanism according to a third embodiment. FIG. 8A is a plan view and FIG. 8B a side view.

In this embodiment, the endless belt members 7 are formed of a magnetic material. Magnets 64 are arranged at constant intervals at those side edges of each substrate 100 which face away from the endless belt members 7, for pinching the substrate and endless belt members 7.

Figure 9A:
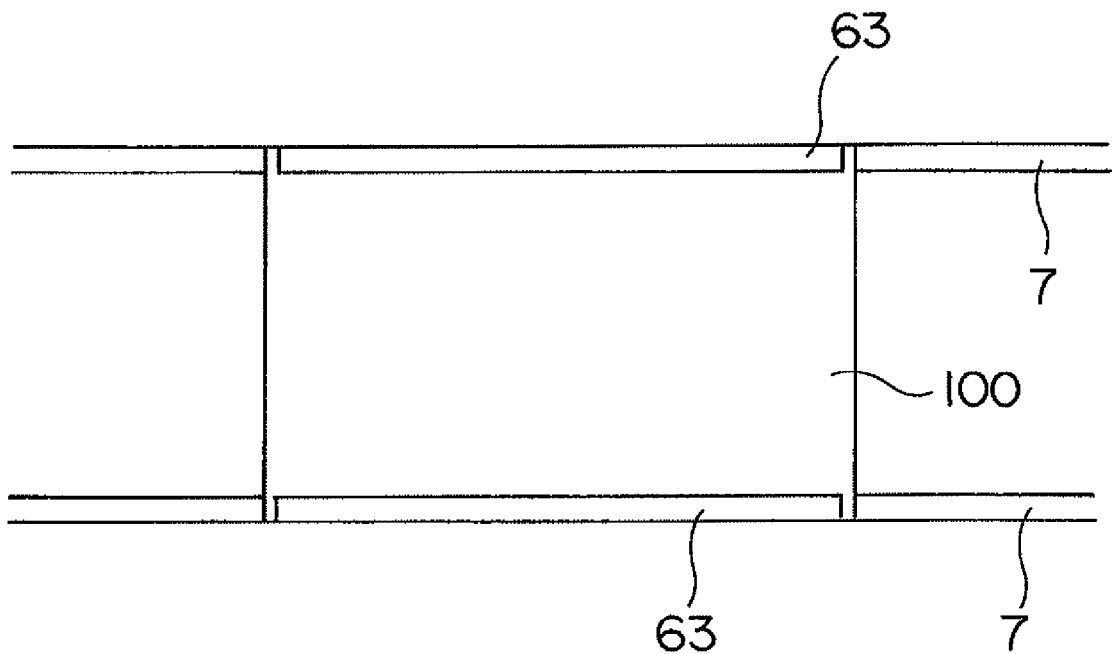
FIG. 9A is an explanatory view of a fixing mechanism according to a fourth embodiment.
Figure 9B:
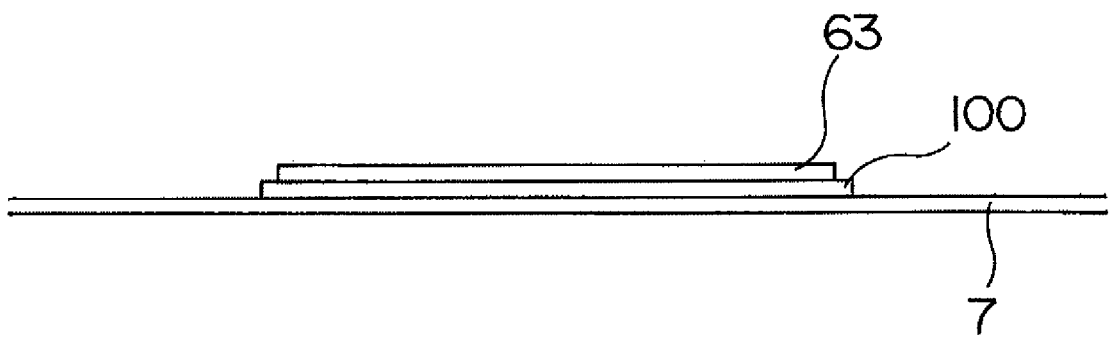
FIG. 9B is an explanatory view of the fixing mechanism according to the fourth embodiment.

FIGS. 9A and 9B are explanatory views of a fixing mechanism according to a fourth embodiment. FIG. 9A is a plan view and FIG. 9B a side view.

In this embodiment also, the endless belt members 7 are formed of a magnetic material. And a construction is employed for fixing the edges of each substrate 100 to the endless belt members 7 using elongate magnets 63 having a length approximately equal to that of the side edges of each substrate 100 parallel to the transport direction.

Figure 10A:
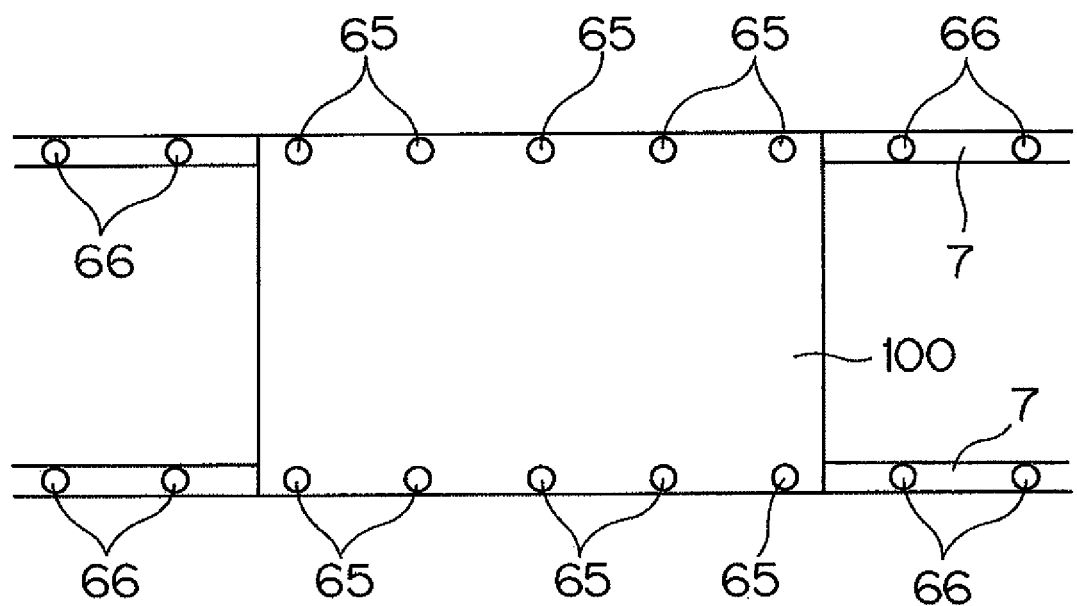
FIG. 10A is an explanatory view of a fixing mechanism according to a fifth embodiment.
Figure 10B:
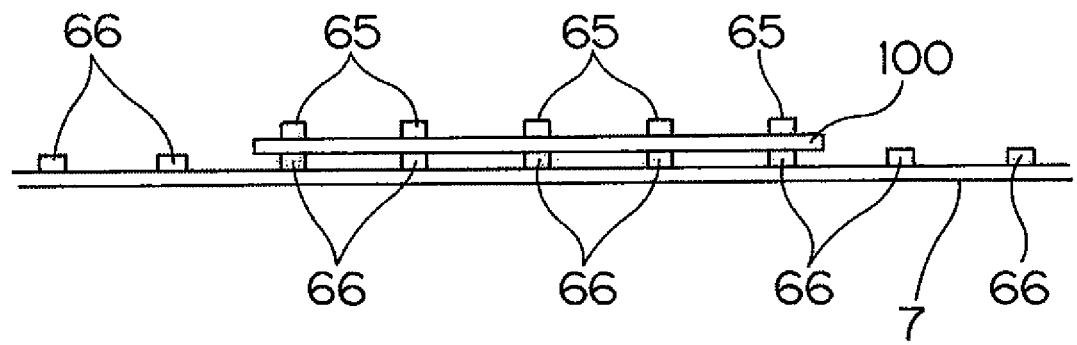
FIG. 10B is an explanatory view of the fixing mechanism according to the fifth embodiment.

FIGS. 10A and 10B are explanatory views of a fixing mechanism according to a fifth embodiment. FIG. 10A is a plan view and FIG. 10B a side view.

In this embodiment, magnets 66 are arranged at constant intervals on the surfaces of endless belt members 7. And magnets 65 are arranged on that surface (upper surface) of each substrate 100 which faces away from the endless belt members 7. In this embodiment, each substrate 100 is transported as supported by the endless belt members 7, with the pair of side edges thereof parallel to the transport direction fixed to the endless belt members 7 by these magnets 65 and 66.

Figure 11A:
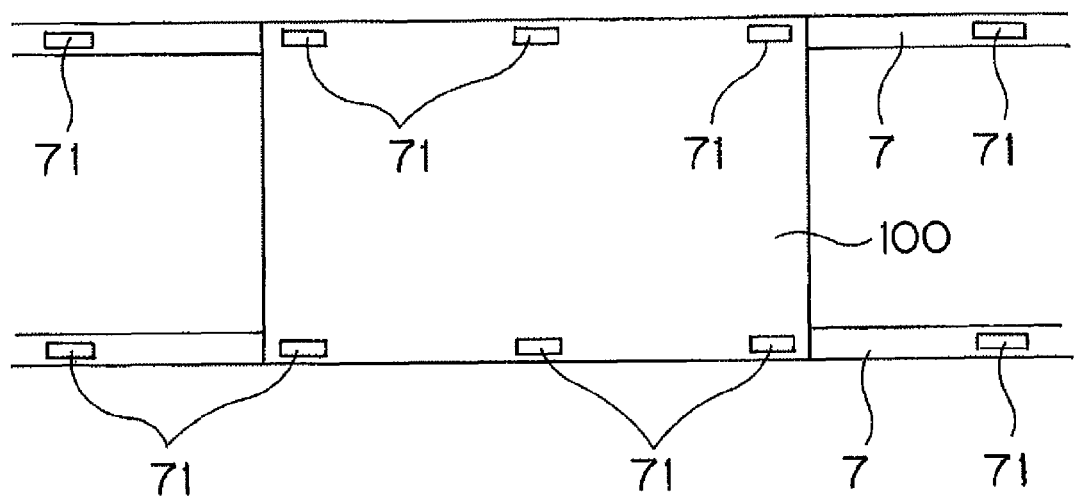
FIG. 11A is an explanatory view of a fixing mechanism according to a sixth embodiment.
Figure 11B:
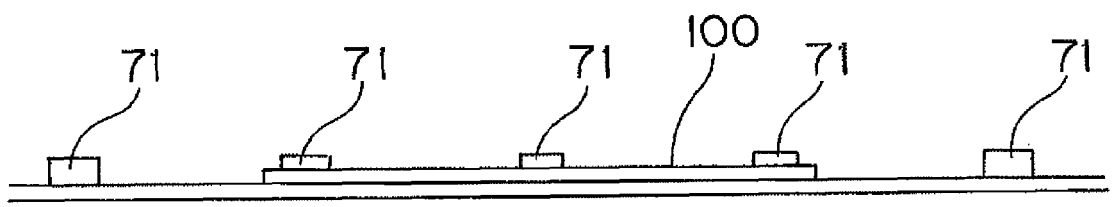
FIG. 11B is an explanatory view of the fixing mechanism according to the sixth embodiment.

FIGS. 11A and 11B are explanatory views of a fixing mechanism according to a sixth embodiment. FIG. 11A is a plan view and FIG. 11B a side view.

The fixing mechanisms according to the first to fifth embodiments described above use magnets to fix the substrates 100 to the endless belt members 7. This sixth embodiment, by contrast, employs a construction for fixing the side edges of each substrate 100 to the endless belt members 7 by engaging pins 71 erected on the endless belt members 7 with bores formed in the substrate 100. That is, in this embodiment, bores are formed at constant intervals at the side edges of each substrate 100 parallel to the transport direction. The endless belt members 7 have pins 71 erected thereon at the same intervals as those of the bores. The substrate 100 is fixed to the endless belt members 7 and transported as supported by the endless belt members 7, while the pins 71 are engaged with the bores of the substrate 100.

Figure 12A:
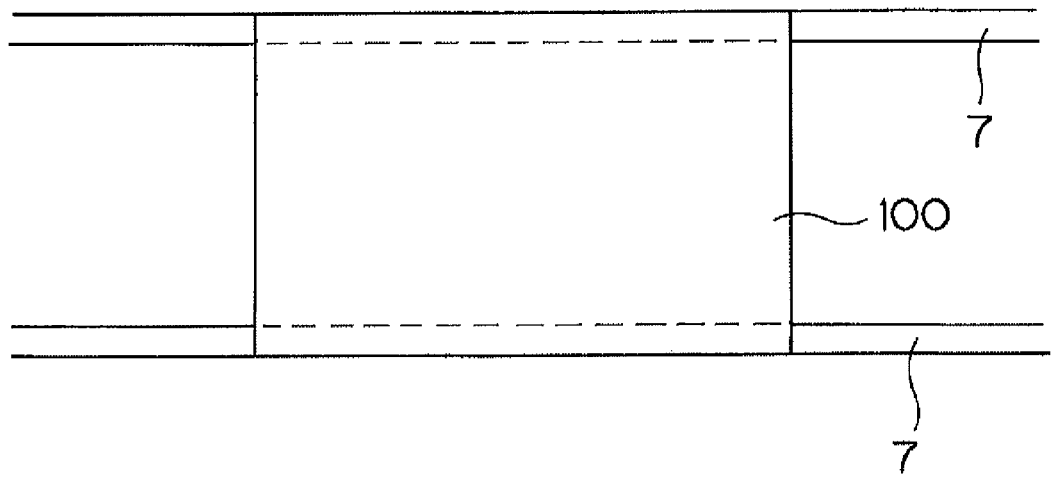
FIG. 12A is an explanatory view of a fixing mechanism according to a seventh embodiment.
Figure 12B:
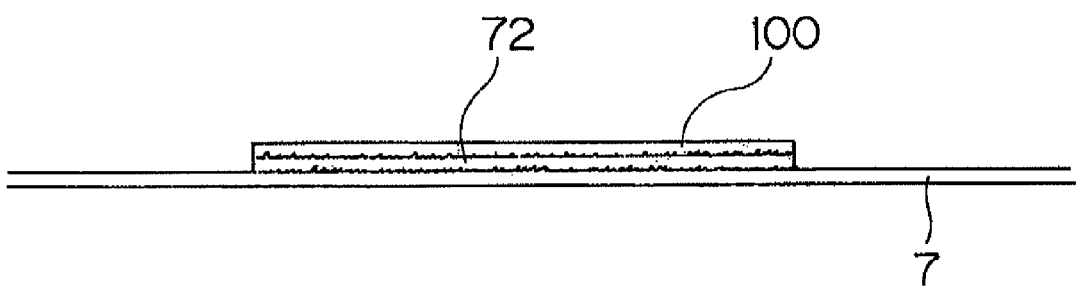
FIG. 12B is an explanatory view of the fixing mechanism according to the seventh embodiment.

FIGS. 12A and 12B are explanatory views of a fixing mechanism according to a seventh embodiment. FIG. 12A is a plan view and FIG. 12B a side view.

This embodiment has a construction for fixing each substrate 100 to the endless belt members 7 by interposing a double-faced adhesive 72 between the substrate 100 and the endless belt members 7.

Figure 13A:
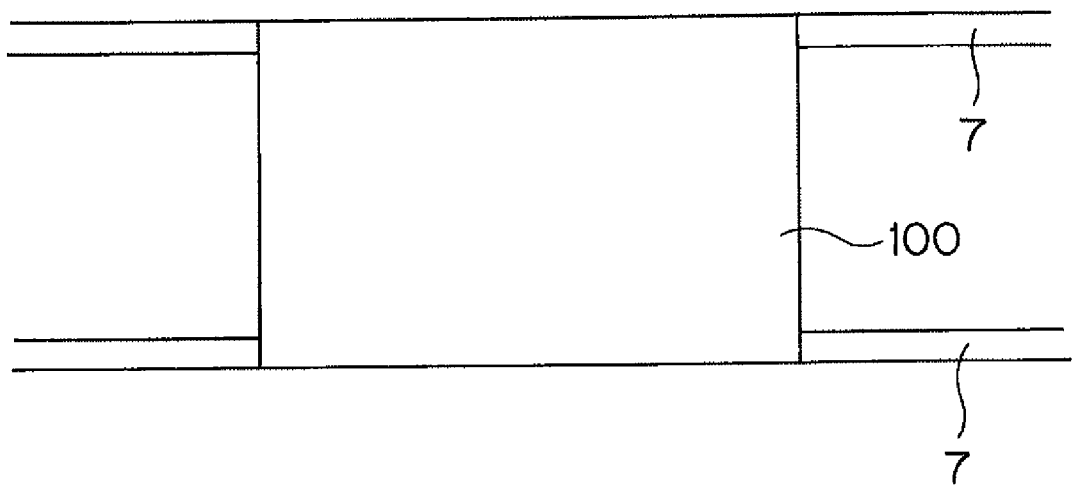
FIG. 13A is an explanatory view of a fixing mechanism according to an eighth embodiment.
Figure 13B:
FIG. 13B is an explanatory view of the fixing mechanism according to the eighth embodiment.

FIGS. 13A and 13B are explanatory views of a fixing mechanism according to an eighth embodiment. FIG. 13A is a plan view and FIG. 13B a side view.

In this embodiment, the endless belt members 7 have surfaces 73 thereof formed of an adhesive material. This embodiment has a construction for fixing each substrate 100 to the endless belt members 7 by placing the substrate 100 on the endless belt members 7.

Figure 14:
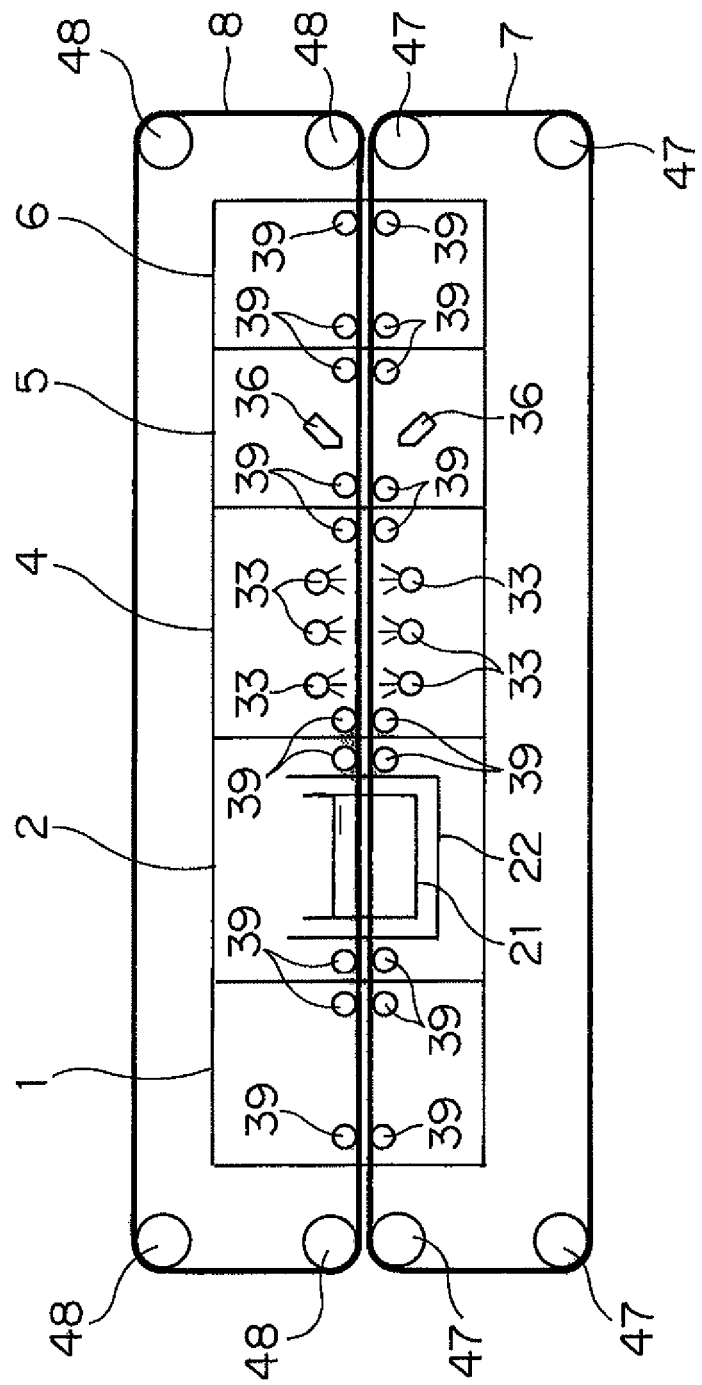
FIG. 14 is a schematic side view of a substrate treating apparatus according to a third embodiment of this invention.

Next, another embodiment of the substrate treating apparatus will be described. FIG. 14 is a schematic side view of a substrate treating apparatus according to a third embodiment of this invention. Like reference numerals are used to identify like parts which are the same as in the first embodiment shown in FIGS. 1 and 2 and will not particularly be described again.

This embodiment has a construction for transporting each substrate 100, with the side edges thereof parallel to the transport direction pinched by an endless belt 7 wound around four pulleys 47 and a second endless belt 8 wound around four pulleys 48.

In this substrate treating apparatus, one of the four pulleys 47 around which the endless belt 7 is wound is a drive pulley rotatable by drive of a motor not shown, and the other three pulleys are driven pulleys. One of the four pulleys 48 around which the second endless belt 8 opposed to the endless belt 7 is wound is a drive pulley rotatable by drive of a motor not shown, and the other three pulleys are driven pulleys. Each of the loading section 1, treating tank 2, rinsing tank 4, drying tank 5 and unloading section 6 has two pairs of nip rollers 39 arranged therein for placing the endless belt 7 and second endless belt 8 in contact with each other.

Figure 15:
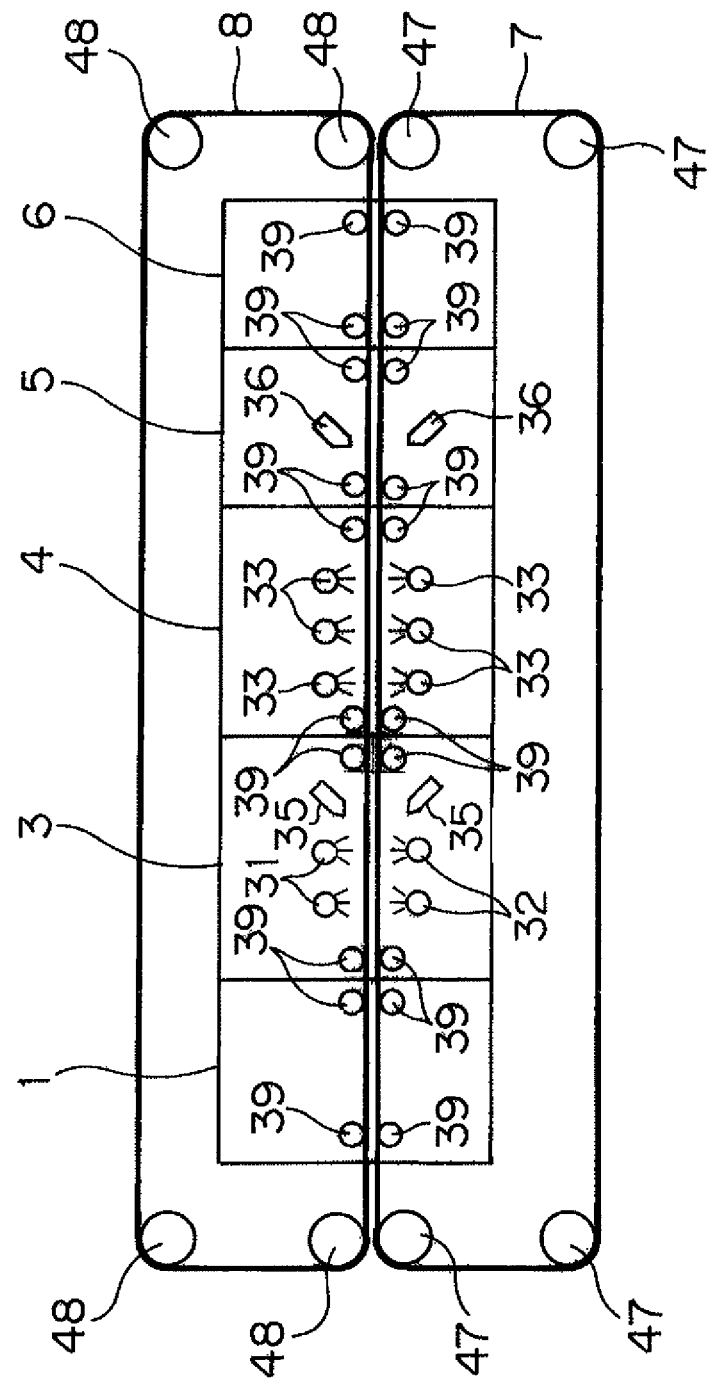
FIG. 15 is a schematic side view of a substrate treating apparatus according to a fourth embodiment of this invention.

Next, a further embodiment of the substrate treating apparatus will be described. FIG. 15 is a schematic side view of a substrate treating apparatus according to a fourth embodiment of this invention. Like reference numerals are used to identify like parts which are the same as in the third embodiment shown in FIG. 14 and will not particularly be described again.

The substrate treating apparatus according to this fourth embodiment employs a treating tank 3 having a construction for spraying the treating solution to both surfaces of each substrate, in place of the treating tank 2 having the treating solution tank 21 in the substrate treating apparatus shown in FIG. 14. This treating tank 3 has a plurality of treating solution jet nozzles 31 for spraying the treating solution to the upper surface of each substrate, a plurality of treating solution jet nozzles 32 for spraying the treating solution to the lower surface of each substrate, and a pair of air knives 35 for blowing compressed air to both surfaces of each substrate to remove the treating solution adhering to the substrates.

Figure 16:
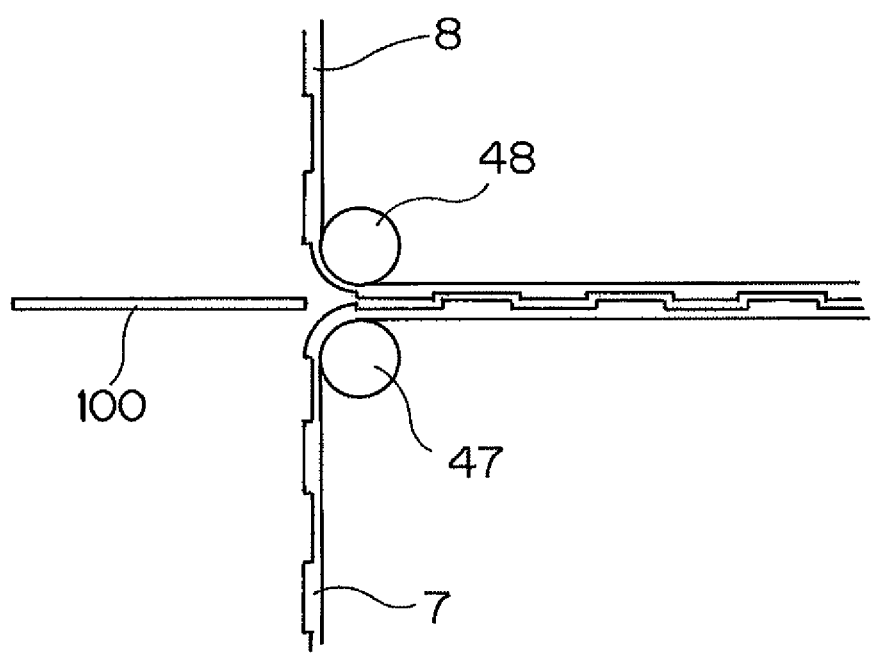
FIG. 16 is an explanatory view showing an insertion of one of a pair of side edges of a substrate parallel to a transport direction of the substrate between an endless belt and a second endless belt.

FIG. 16 an explanatory view showing an insertion of one of the pair of side edges of each substrate 100 parallel to the transport direction between the endless belt 7 and second endless belt 8 in the substrate treating apparatus shown in FIGS. 14 and 15.

The endless belt 7 and second endless belt 8 have mutually engageable projections and recesses formed on the contact surfaces thereof. Each substrate 100 has the pair of side edges parallel to the transport direction pinched by the endless belt 7 and second endless belt 8, and is transported free of displacement by the action of these projections and recesses. That is, the second endless belt 8 acts as fixing device opposed to the endless belt 7 for pinching each substrate 100 with the endless belt 7.

Figure 17:
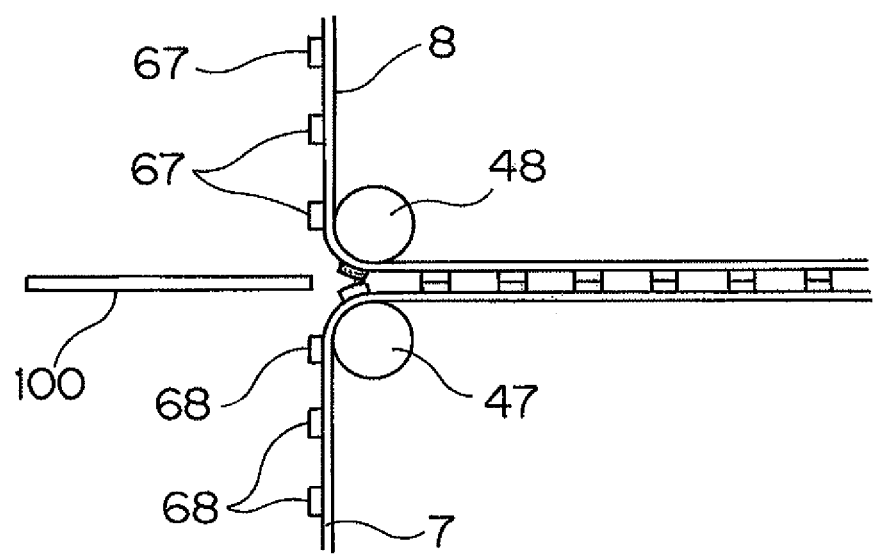
FIG. 17 is an explanatory view showing an insertion of one of the pair of side edges of a substrate parallel to the transport direction of the substrate between an endless belt and a second endless belt.

Next, a modification of the substrate treating apparatus according to the third and fourth embodiments will be described. FIG. 17 is an explanatory view showing an insertion of one of the pair of edges of each substrate 100 parallel to the transport direction between the endless belt 7 and second endless belt 8 in this modification.

In this embodiment, the endless belt 7 has magnets 68 arranged at constant intervals on a surface thereof. Likewise, the second endless belt 8 has magnets 67 arranged on a surface thereof at the same intervals as those of the magnets 68 on the endless belt 7. Each substrate 100 has the pair of side edges parallel to the transport direction fixed to the endless belt 7 by the action of these magnets 67 and 68, and is transported free of displacement as pinched by the endless belt 7 and second endless belt 8.

Figure 18:
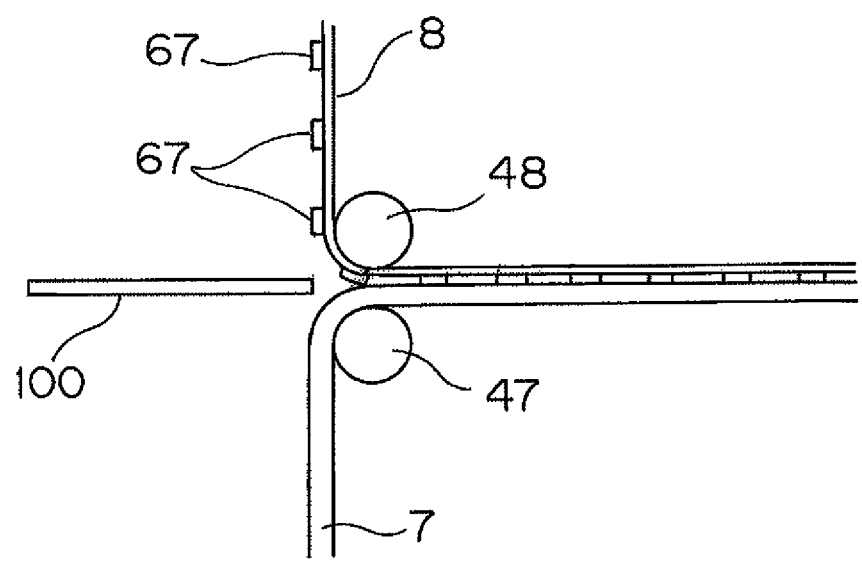
FIG. 18 is an explanatory view showing an insertion of one of the pair of edges of a substrate parallel to the transport direction of the substrate between an endless belt and a second endless belt.

Next, a further modification of the substrate treating apparatus according to the third and fourth embodiments will be described. FIG. 18 is an explanatory view showing an insertion of one of the pair of side edges of each substrate 100 parallel to the transport direction between the endless belt 7 and second endless belt 8 in this modification.

In this embodiment, the endless belt 7 is formed of a magnetic material. On the other hand, the second endless belt 8 has magnets 67 arranged at constant intervals on a surface thereof. Each substrate 100 has the pair of side edges parallel to the transport direction fixed to the endless belt 7 by the action of the endless belt 7 and the magnets 67 arranged on the second endless belt 8, and is transported free of displacement as pinched by the endless belt 7 and second endless belt 8.

This invention may be embodied in other specific forms without departing from the spirit or essential attributes thereof and, accordingly, reference should be made to the appended claims, rather than to the foregoing specification, as indicating the scope of the invention.

This application claims priority benefit under 35 U.S.C. Section 119 of Japanese Patent Application No. 2012-075690 filed in the Japanese Patent Office on Mar. 29, 2012, the entire disclosure of which is incorporated herein by reference.

What is claimed is:

1. A substrate treating apparatus for simultaneously treating both surfaces of a flexible rectangular substrate by horizontally transporting the substrate and supplying a treating solution to both the surfaces of the substrate, comprising:
a pair of endless belts for supporting a pair of side edges parallel to a transport direction of the substrate; and
a fixing device for fixing the pair of side edges of the substrate parallel to the transport direction to the pair of endless belts;
wherein the fixing device comprises a pair of magnets for pinching the endless belts and the side edges parallel to the transport direction of the substrate; and
wherein said pair of magnets comprises a plurality of pairs of magnets at positions along said side edges parallel to the transport direction;
wherein the fixing device further comprises a pair of feeders for supplying said pairs of magnets to said positions for pinching the endless belt members and the side edges of the substrate parallel to the transport direction; and
contact members for contacting and removing the pairs of magnets pinching the endless belt members and the side edges of the substrate parallel to the transport direction from said positions.

2. The substrate treating apparatus according to claim 1 wherein the apparatus treats both surfaces of the substrate with the treating solution by passing the substrate transported as fixed to the pair of endless belts, through the treating solution stored in a treating tank.

3. The substrate treating apparatus according to claim 1 wherein the apparatus treats both surfaces of the substrate with the treating solution by spraying the treating solution toward both surfaces of the substrate transported as fixed to the pair of endless belts.

4. The substrate treating apparatus according to claim 1, wherein said pair of magnets comprises a pair of elongate magnets extending along said side edges parallel to the transport direction.

* * * * *